United States Patent [19]

Arakawa

[11] 4,402,064

[45] Aug. 30, 1983

[54] NONVOLATILE MEMORY

[75] Inventor: Hideki Arakawa, Yokohama, Japan

[73] Assignee: Fujitsu Limited, Kawasaki, Japan

[21] Appl. No.: 324,686

[22] Filed: Nov. 25, 1981

[30] Foreign Application Priority Data

Nov. 26, 1980 [JP] Japan ............................... 55-166355

[51] Int. Cl.³ .............................................. G11C 11/40
[52] U.S. Cl. .................................. 365/185; 365/189; 357/23
[58] Field of Search ................. 365/49, 174, 185, 189; 357/23

[56] References Cited

U.S. PATENT DOCUMENTS 4,330,850  5/1982  Jacobs et al. ........................ 365/185

*Primary Examiner*—Terrell W. Fears
*Attorney, Agent, or Firm*—Staas & Halsey

[57] ABSTRACT

A nonvolatile memory, especially an electrically erasable and programmable read only memory (EEPROM) includes an array of memory cells. In each of the memory cells four transistors are formed, that is a read transistor and a first selecting transistor connected in series, and a write-erase transistor and a second selecting transistor connected in series. The write-erase transistor has a floating gate partially provided with a thin insulation layer thereunder. The read transistor also has a floating gate provided with a thick insulation layer thereunder. The first and second selecting transistors are turned to ON or OFF together.

11 Claims, 13 Drawing Figures

NONVOLATILE MEMORY

BACKGROUND OF THE INVENTION

The present invention relates to a nonvolatile memory, and more particularly relates to a nonvolatile semiconductor EE-PROM (Electrically Erasable-Programmable Read-Only Memory).

A programmable ROM is widely utilized in, for example, a computer-aided data processing system. Usually, a ROM can be programmed only once, either at the factory or in the field, by electrically fusing or otherwise removing unwanted internal links. Accordingly, the conventional programmable ROM has a defect in that a mistake in the programming cannot be corrected. For the purpose of overcoming the above mentioned defect, an EPROM (Erasable Programmable ROM) has been proposed and widely utilized in many nations. In the EPROM, the stored data can be erased by ultraviolet light and each bit can be electrically reprogrammed with appropriate voltage pulses. However, in the conventional EPROM, since ultraviolet light is required for reprogramming the stored data, it is not easy for an operator to freely reprogram the stored data.

In recent years, a nonvolatile EE-PROM has been proposed, for example, in the publication "Electronics," Feb. 28, 1980 pages 113 through 117, entitled "16-K EE-PROM Relies on Tunneling for Byte-Erasable Program Storage". The EE-PROM is basically comprised of a transistor having a source, a drain, a floating gate and a control gate, in which the floating gate partially includes an area of a very thin insulation layer on the order of a hundred Å. Thus, a tunnel effect can be created, via the thin insulation, between the drain and the floating gate, and thereby data, to be stored in each memory cell, is reprogrammed.

The EE-PROM is very useful for an operator in, for example, the computer-aided data processing system, because, as previously mentioned, he can freely reprogram the stored data without using ultraviolet light. However, such an EE-PROM circuit of the prior art has the following two defects. Firstly as explained in detail below, undesired erasure of data often occurs in some of the half-selected memory cells. Secondly, it is not relatively easy to mass produce the EE-PROM circuit devices.

SUMMARY OF THE INVENTION

Therefore, it is an object of the present invention to provide a nonvolatile memory which overcomes the two above-mentioned defects.

BRIEF DESCRIPTION OF THE DRAWINGS

The present invention will be more apparent from the ensuing description with reference to the accompanying drawings wherein.

DETAILED DESCRIPTION OF THE PREFERRED EMBODIMENTS

Figure 1:
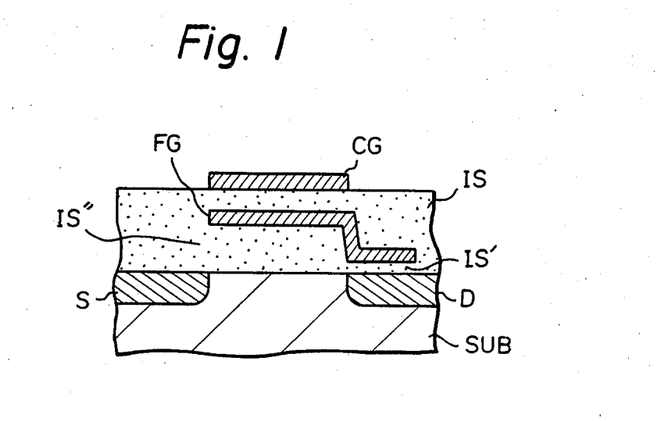
FIG. 1 is a cross-sectional view showing a known prior art EE-PROM.

FIG. 1 is a cross-sectional view of a known prior art EE-PROM. In FIG. 1, a basic transistor, especially, an FET (Field Effect Transistor) of the EE-PROM is formed in and on a semiconductor substrate SUB. A source S and a drain D of the transistor are formed therein. On the substrate SUB, a floating gate FG and a control gate CG are formed via an insulation layer ($SiO_2$) IS. The floating gate FG partially faces the substrate, especially the drain D, via a very thin insulation layer IS'. The floating gate FG, cooperating with the thin insulation layer IS', is necessary to construct the electrically erasable (EE) memory. When a positive high voltage is applied to the control gate CG, the voltage level of the floating gate FG is also increased by the positive high voltage, due to the presence of a capacitor formed between the gate CG and the gate FG adjacent a relatively thick insulation layer IS". At this time, if the voltage level, to be applied to the drain D, is set at 0 V, an extremely high electric field is created, across the thin insulation layer IS', between the gate FG and the drain D. Then electron charges are injected from the drain D into the floating gate FG to provide a tunnel effect. Thereby an erase operation is completed. In contrast, in a write operation, the voltage level of the control gate CG is set at 0 V and the voltage level of the drain D is set at a positive high voltage, and thus the electron charges are injected from the floating gate FG into the drain D.

Figure 2:
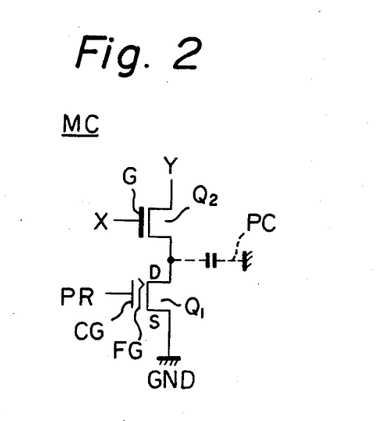
FIG. 2 is a circuit diagram of a conventional memory cell including the transistor of FIG. 1 therein.

FIG. 2 is a circuit diagram of a conventional memory cell including the transistor of FIG. 1 therein. The memory cell MC of FIG. 2 is fabricated as a two-transistor cell type memory cell. The memory cell MC is comprised of a programming transistor $Q_1$ and a selecting transistor $Q_2$ which corresponds to the transistor of FIG. 1. The symbols D, S, FG and CG denote respectively the aforesaid drain, source, floating gate and control gate. The selecting transistor $Q_2$ is used for accessing the transistor $Q_1$ when this memory cell MC is specified by an address signal. The programming transistor $Q_1$ functions to store, read and write data alternately. These transistors $Q_1$ and $Q_2$ are connected in series with each other along a column line Y, namely a bit line, and to ground GND. The gate G of the transistor $Q_2$ is connected to a row line X, namely a word line. The control gate CG of the transistor $Q_1$ is connected to a program line PR which is arranged in parallel with the row line X.

Figure 3:
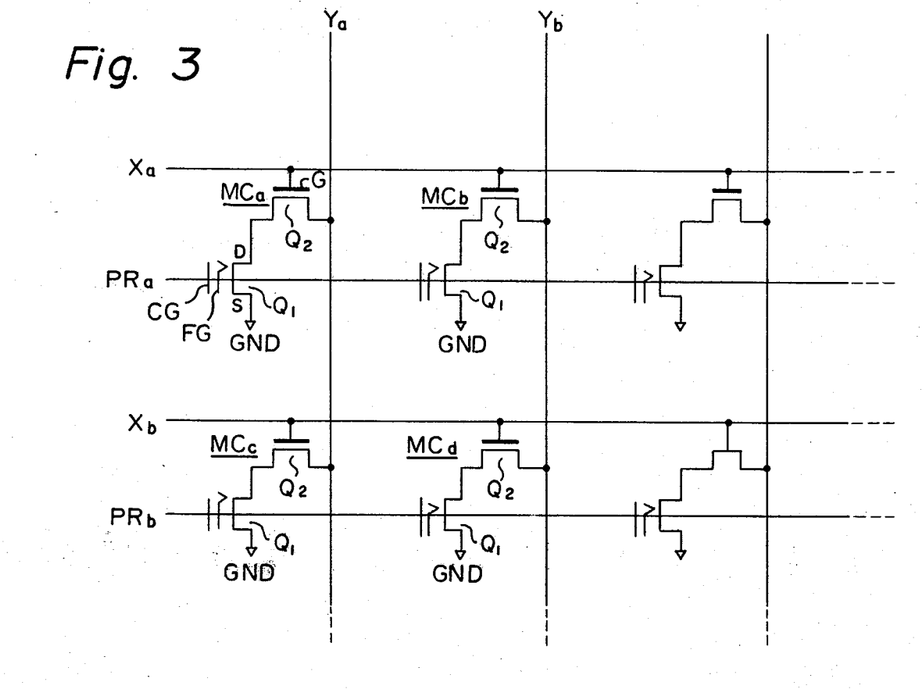
FIG. 3 is a circuit diagram of a conventional memory comprised of memory cells MC shown in FIG. 2.

FIG. 3 is a circuit diagram of a conventional memory comprised of memory cells MC shown in FIG. 2. In FIG. 3, the members having identical reference symbols are substantially the same as those of FIG. 2. In the memory, a write operation is achieved as follows. If the memory cell $MC_a$ is accessed, a positive high voltage, such as +18 V, is applied to the column line $Y_a$ and simultaneously a positive high voltage, such as +20 V is applied to the row line $X_a$, so that the selecting transistor $Q_2$ of the specified memory cell $MC_a$ is turned to ON. At the same time, a positive high voltage is applied to the drain D of the transistor $Q_1$ and zero voltage is applied to the control gate CG. Thus, the electron charges are removed from the floating gate FG and a logic "1" is written in the memory cell $MC_a$. In the memory of FIG. 3, half-selected memory cells, such as $MC_b$, $MC_c$ and so on, and non-selected memory cells, such as $MC_d$ and so on, exist at the same time, other than selected memory cell $MC_a$. The half-selected memory cell is defined as follows. That is, the corresponding column line Y is selected, but, the corresponding row line X is not selected, alternately, the corresponding row line X is selected, but, the corresponding column line Y is not selected. When both column and row lines are not selected, a non-selected memory cell is obtained. In this case, an undesired write operation cannot be expected, because no positive high voltage is applied to any drain D of the transistor $Q_1$ in each of the memory cells $MC_b$, $MC_c$ and $MC_d$ - - - . It should be noted that the write operation is performed when zero volt is applied to the control gate CG and at the same time the positive high voltage is applied to the drain D.

When a whole-erase operation is required with respect to the memory of FIG. 3, firstly, zero volt is applied to all the column lines (Y), secondly, a positive high voltage $V_H$ is applied to all the word lines (X), and thirdly, the positive high voltage $V_H$ is applied to all the control gates CG, which three conditions are satisfied simultaneously. Thus, the electron charges are injected from the drain D into the floating gate FG in each of the transistors $Q_1$. It should be noted that the write operation is performed when zero volt is applied to the control gate CG and at the same time the positive high voltage is applied to the drain D.

In the above-mentioned write and whole-erase operations, no problem occurs. However, certain problems are often expected to occur when a partial-erase operation is achieved, such as an erase operation with respect to memory cells comprising each word of 8 bits. If some word is accessed in the memory, only the memory cells (MCs) for composing that accessed word must satisfy the aforementioned three conditions, that is, firstly, zero volt is applied to the column lines (Y), secondly, the positive high voltage $V_H$ is applied to the word line (X), and thirdly, the positive high voltage $V_H$ is applied to the control gates CG. Thus, electron charges are injected from each drain D into the corresponding floating gate FG in the selected memory cells of that word.

However, the above-mentioned problem may often occur in the half-selected memory cells, especially the half-selected memory cells defined by the row line $X_a$ and the remaining column lines other than the column line $Y_a$, which memory cell corresponds to the memory cells (MCs) arranged along the row line $X_a$ shown in FIG. 3. In such half-selected memory cells, not only the word line $X_a$ but also the program line $PR_a$ are selected.

Therefore, the corresponding transistors $Q_2$ of the half-selected memory cells are turned ON. Although these transistors $Q_2$ are ON, since the corresponding column lines, except for the line $Y_a$, are left in a floating state, the drains D of the transistors $Q_1$ of the half-selected memory cells are also left in a floating state through the respective transistors $Q_2$ which are now conductive. In this case, although the positive high voltage is applied to the respective control gates CG of the half-selected memory cells, the voltage level of the corresponding drains D are expected to increase toward a high voltage level via a so-called capacitor coupling between each gate FG and its corresponding drain D. Therefore, it is also expected that no high electric field will be created between each floating gate FG and its corresponding drain D. As a result, it is expected that no undesired erase operation will be achieved in each half-selected memory cell.

However, during actual operation, the previously mentioned problem occurs, that is, undesired erase operations are achieved in such half-selected memory cells. The reason for this is as follows. When the positive high voltage is applied to the control gate CG, the voltage level of the floating gate FG is also increased due to a capacitor coupling therebetween. In this case, a channel between the drain D and the source, becomes conductive because of the positive high voltage. When the channel is conductive, the drain D is not left in the aforesaid floating state but is changed to the same voltage level as that of the source S, which level is 0 V. Consequently, a condition, which is identical to the condition for achieving the erase operation, is satisfied, and thus undesired erasing occurs in some of the half-selected memory cells, so that the electron charges are injected from each drain D to each corresponding floating gate FG.

The above-mentioned undesired erasing may be prevented by employing an additional transistor which acts to disconnect the source S from groun GND, selectively. However, this idea for employing such an additional transistor is not perfect in preventing all the undesired erasing. The important matter is to pay attention to the existence of a parasitic capacitor formed between the drain D and the substrate SUB (refer to the parasitic capacitor PC shown in FIG. 2). To make the matter worse, the capacitance value of the capacitor PC is considerably large. In addition, the capacitance value of the capacitor PC may further be increased, because a parasitic capacitor, formed between the substrate SUB and the source S, is also added to the parasitic capacitor PC of the drain D. Since the drain D is provided with a large parasitic capacitor, the voltage level at the drain D cannot change at high speed. Accordingly, the voltage level at the drain D cannot increase at high speed when the positive high voltage $V_H$ is applied to the control gate CG. In other words, although the voltage level at the gate CG and also the gate FG changes sharply, the voltage level at the drain D cannot change so sharply. Therefore, a condition, corresponding to the erase operation, is unnecessarily satisfied in a moment during the term in which the voltage level at the drain D follows toward the positive high voltage level at the gate CG and saturates the corresponding positive high voltage level. Although such undesired erasing occurs in a very short time, if such undesired erasing occurs repeatedly, the stored data will be erased completely from the floating gate FG, which is one of the previously mentioned defects of the prior art.

Regarding one memory, in which the row line X and also the corresponding program line PR are activated simultaneously, the control gates CG of the non-selected and half-selected memory cells, especially the half-selected memory cells having non-selected row lines X and selected column lines Y, are not selected (activated). Accordingly, no electron charges are injected from the drains D to the respective floating gates FG. As a result, in such memory, above-mentioned undesired erasing cannot be expected to occur. Contrary to the above, in another memory in which all the control gates are selected (activated) to be a positive high voltage $V_H$, similar defects will be produced with respect to the half-selected memory cells having selected row lines X and non-selected column lines Y.

There may be a possibility to eliminate the occurrence of such an undesired erase operation by applying the positive high voltage $V_H$ not only to the control gate CG but also to the column line Y which is connected to the drain D of the programming transistor $Q_1$. However, such possibility is not realized, because a complicated decoder circuit would have to be incorporated into the memory circuit. It should be noted that the simple decoder circuit of the prior art is sufficient merely to supply high voltage to the column line Y during the erase operation and to make the column line Y to be in a floating state.

Figure 4A:
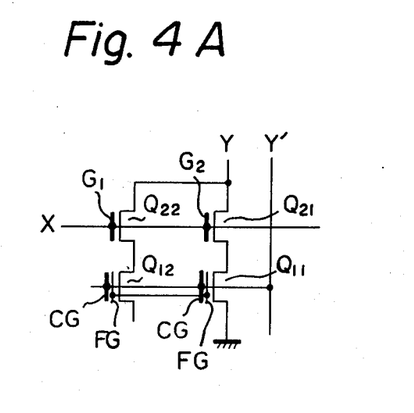
FIG. 4A is an equivalent circuit diagram of a memory cell MC according to the present invention.
Figure 4B:
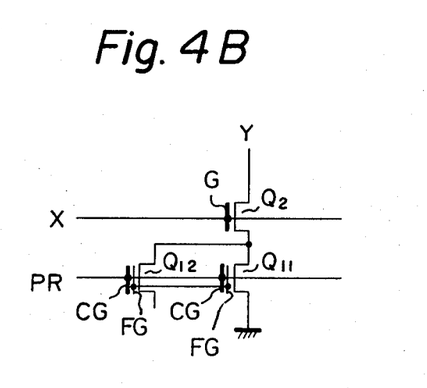
FIG. 4B is an equivalent circuit diagram of a prior art memory cell MC.

FIG. 4A depicts an equivalent circuit diagram of a memory cell MC according to the present invention, while, FIG. 4B depicts an equivalent circuit diagram of the memory cell MC of the prior art. Although, each programming transistor $Q_1$ of FIGS. 2 and 3 is depicted as a single transistor element, in the actual arrangement of the programming transistors $Q_1$, each of the transistors $Q_1$ is divided into a first transistor $Q_{11}$, acting as a read transistor, having the thick insulation layer $IS''$ and a second transistor $Q_{12}$, acting as a write-erase transistor, having a partially thin insulation layer $IS'$.

The essential points of the present invention reside in that, as seen from FIG. 4A, the selecting transistor $Q_2$ of FIG. 2 or 3 is also divided into a first selecting transistor $Q_{21}$ which is connected in series with the read transistor $Q_{11}$, as usual, and a second selecting transistor $Q_{22}$ which is connected in series with the write-erase transistor $Q_{12}$.

Figure 5:
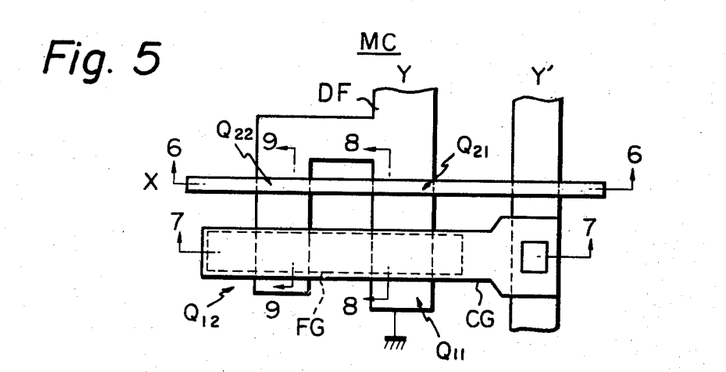
FIG. 5 is a plan view of a memory cell having the circuit diagram of FIG. 4A, according to the present invention.
Figure 6:
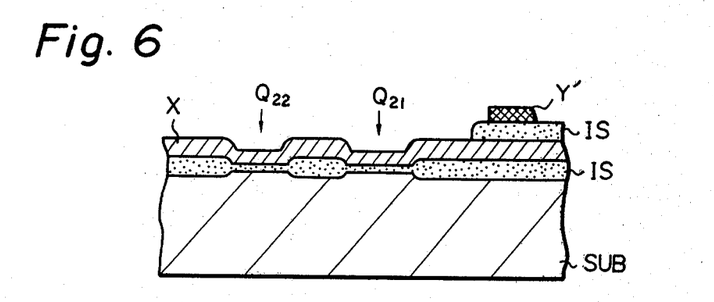
FIG. 6 is a cross-sectional view of the memory cell shown in FIG. 5 taken along the line 6—6.
Figure 7:
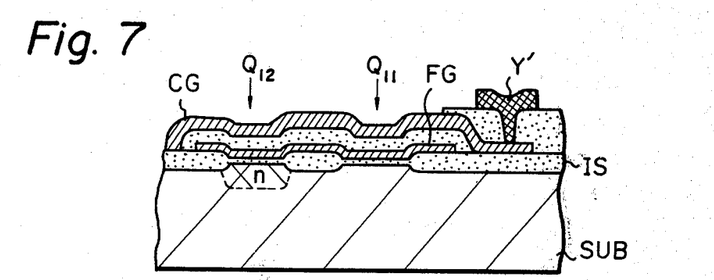
FIG. 7 is a cross-sectional view of the memory cell shown in FIG. 5 taken along the line 7—7.
Figure 8:
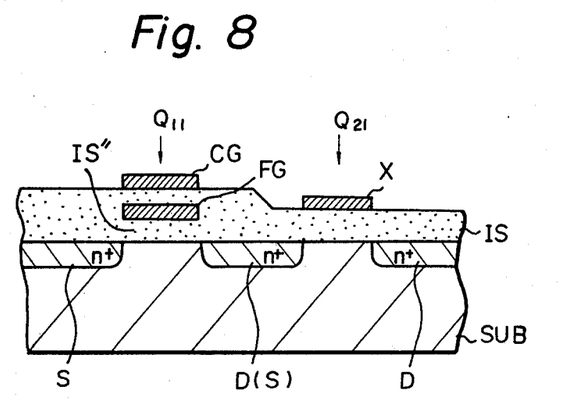
FIG. 8 is a cross-sectional view of the memory cell shown in FIG. 5 taken along the line 8—8.
Figure 9:
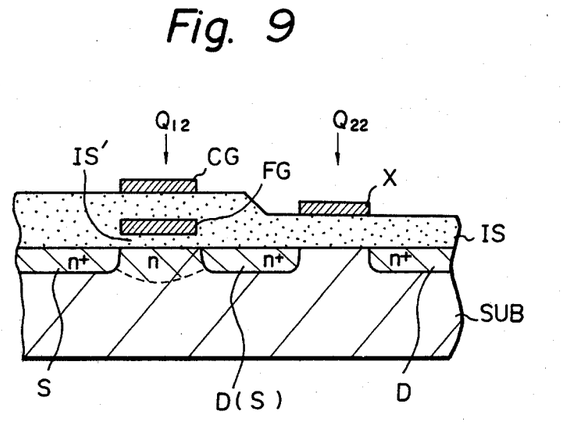
FIG. 9 is a cross-sectional view of the memory cell shown in FIG. 5 taken along the line 9—9.

FIG. 5 illustrates a plan view of a memory cell having the circuit diagram of FIG. 4A, according to the present invention. In FIG. 5, the members having the same reference symbols are identical to those of FIG. 4A. The reference symbol DF denotes a diffusion area. The construction of the memory cell MC shown in FIG. 5 will be clarified with reference to FIGS. 6, 7, 8 and 9. FIG. 6 is a cross-sectional view of the memory cell shown in FIG. 5 taken along the line 6—6. FIG. 7 is a cross-sectional view of the memory cell shown in FIG. 5 taken along the line 7—7. FIG. 8 is a cross-sectional view of the memory cell shown in FIG. 5 taken along the line 8—8. FIG. 9 is a cross-sectional view of the memory cell shown in FIG. 5 taken along the line 9—9.

In FIG. 5, as previously mentioned with reference to FIG. 4A, the programming transistor $Q_1$ of FIG. 3 is divided into the read transistor $Q_{11}$ and the write-erase transistor $Q_{12}$. The selecting transistor $Q_2$ of FIG. 3 is also divided into the first selecting transistor $Q_{21}$ and the second selecting transistor $Q_{22}$. The diffusion area DF contains $n^+$-type impurities therein (see FIGS. 8 and 9). The diffusion area DF is electrically connected to the column line Y (see FIG. 5). The diffusion area DF is formed to be a U-shaped area, as seen from FIG. 5. The two gates X and CG traverse across and over the diffusion area DF so as to form four transistors $Q_{11} \sim Q_{22}$ at respective cross portions. Under the gates CG, FG and the row line X, channels are created at respective transistors $Q_{11} \sim Q_{22}$. Especially, in the channel of the transistor $Q_{12}$, an n-type depletion region is formed. The drain D of the transistor $Q_{12}$ is shorted with the source S of the transistor $Q_{22}$, as seen from the area D(S) of FIG. 9. The floating gate FG of the transistor $Q_{12}$ is provided with a relatively thin insulation layer $IS'$ thereunder, but, other floating gates are provided with the relatively thick insulation layer $IS''$, as seen from FIGS. 8 and 9. This insulation layer $IS'$ is thin enough to create the tunnel effect. Regarding the transistor $Q_{11}$, the impurity density of the substrate, located under the floating gate FG, may not be the same as that of the drain D thereof, alternately, that impurity density may be a value which enables creation of a full depletion state of this transistor, even though electron charges are fully injected into that gate FG.

Although, in FIG. 2, the program line PR is arranged in parallel with the row line X, and program line of the present invention is distributed perpendicular to the row line X and at the same time in parallel with the column line Y, as the program line $Y'$, which may be clarified with reference to FIGS. 4A and 5. The program line $Y'$ is commonly connected to the control gate CG of each memory cell MC, which cells are arranged in parallel with the column line Y. A desired one of the program lines $Y'$ can also be selected by means of a usual decoder circuit which selects a desired one of the column lines (Y).

Figure 10:
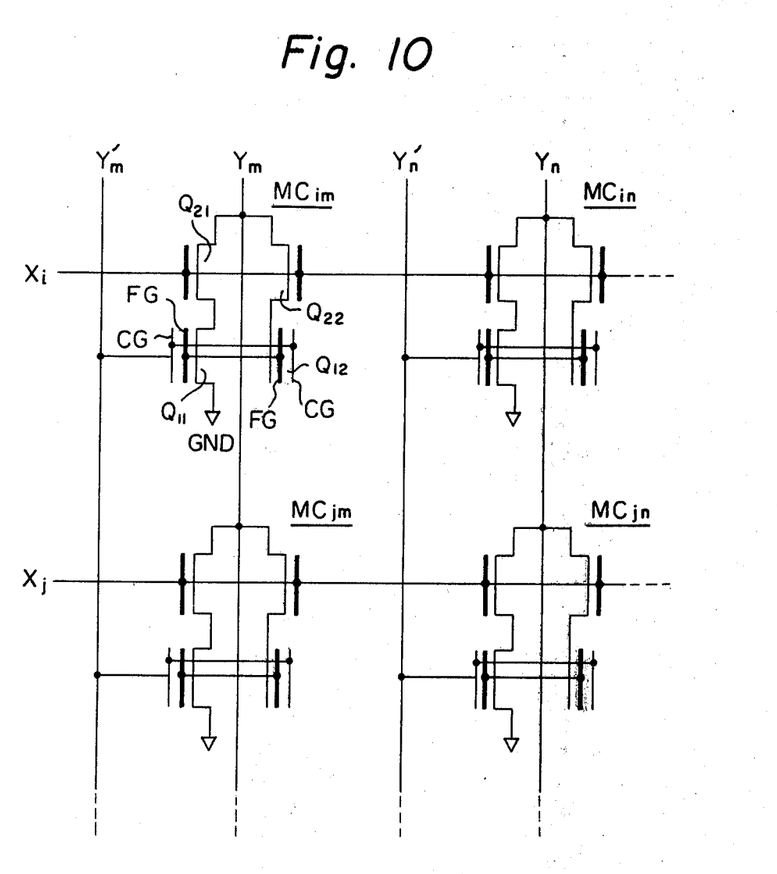
FIG. 10 is a memory circuit diagram comprised of many memory cells according to the present invention shown in FIGS. 5 through 9.

The write and erase operations will be clarified with reference to FIG. 10. FIG. 10 is a memory circuit diagram comprised of many memory cells according to the present invention shown in FIGS. 5 through 9. In FIG. 10, only two column lines are illustrated as $Y_m$ and $Y_n$, only two row lines are illustrated as $X_i$ and $X_j$, only two program lines are illustrated as $Y'_m$ and $Y'_n$ and only four memory cells are illustrated as $MC_{im}$, $MC_{in}$, $MC_{jm}$ and $MC_{jn}$. Further it should be understood that, in each memory cell (MC), the locations of the transistors ($Q_{22}$, $Q_{12}$) and ($Q_{21}$, $Q_{11}$) are reversed with respect to the locations thereof shown in FIG. 5, so as to simplify the illustration of the wiring diagram of FIG. 10. When the write operation is commenced, in the selected cell, for example $MC_{im}$, of the memory cells, a positive high voltage is applied to the column line $Y_m$ ($Y_m = V_H$), zero voltage is applied to the program line $Y'_m$ ($Y'_m = 0$) and the positive high voltage is applied to the row line $X_i$ ($X_i = V_H$), and accordingly, the first and second selecting transistors $Q_{21}$ and $Q_{22}$ are turned to ON. At the same time the positive high voltage is applied to each drain D of the read and write-erase transistor $Q_{11}$ and $Q_{12}$. In this case, since zero voltage is applied to the control gate CG, the electron charges are removed from the floating gate FG of the transistor $Q_{12}$ to the drain D thereof. Thus, the write operation is completed. In the case as mentioned above, regarding the non-selected memory cell $MC_{jn}$ and the half-selected memory cells $MC_{in}$ and $MC_{jm}$, since no positive high voltage $V_H$ is applied to any drains of the corresponding transistors $Q_{11}$ and $Q_{12}$, undesired write operation for these non-selected and half-selected memory cells cannot be expected to occur.

When the whole-erase operation is commenced, zero voltage is applied to all the column lines ($Y_m$, $Y_n$ - - - ), the positive high voltage $V_H$ is applied to all the row lines ($X_i$, $X_j$ - - -) and the positive high voltage $V_H$ is applied to all the program lines ($Y'_m$, $Y'_n$ - - -) and thereby the electron charges are injected from the drain D of each transistor $Q_{12}$ to the floating gate FG thereof. Thus, the whole-erase operation is completed.

When the partial-erase operation is commenced, a similar condition to the above whole-erase operation is satisfied with respect only to the selected memory cell, for example $MC_{im}$. That is, zero voltage is applied to the column line $Y_m$, the positive high voltage $V_H$ is applied to the program line $Y'_m$ and the positive high voltage $V_H$ is applied to the row line $X_i$. In this case, regarding the half-selected memory cell $MC_{in}$ having the selected row line $X_i$ and the non-selected column line $Y_n$, no undesired partial-erase operation is performed in such half-selected memory cell $MC_{in}$, nor in identical other half-selected memory cells. This is because, firstly, the corresponding program lines $Y'_n$ and so on are not selected, and accordingly the corresponding control gates CG are left in an open state or zero voltage state, in which no undesired erase operation can be expected to occur. Secondly, regarding the half-selected memory cells, for example $MC_{jm}$, having the non-selected row line X, and the selected column line Y, the control gates CG of these half-selected memory cells receive the position high voltage $V_H$, however, the write-erase transistors $Q_{12}$ are left in floating state, and accordingly no undesired erase operation can be performed. Thirdly, in the memory cells, the write-erase transistor $Q_{12}$ is fabricated in a small size, and therefore, the parasitic capacitor (refer to PC in FIG. 2) formed between the drain D of the transistor $Q_{12}$ and the substrate can also be very small in area. Consequently, the voltage level developed at the drain D of the write-erase transistor $Q_{12}$ can quickly follow the change of the voltage level developed at the control gate CG. As previously mentioned, since the parasitic capacitor PC of the prior art is considerably large, an undesired erase operation is often performed. Thus, no injection of the electron charges into the floating gate FG is expected in the half-selected memory cells. Further, no injection of the electron charges into the floating gate FG is expected in the non-selected memory cells.

In FIG. 10, when the read operation is achieved, the positive voltage is applied to both the row and column lines X, Y of the selected memory cell MC. If the selected memory cell MC stores the logic "1" (no electron charges are held at the floating gate FG thereof), the voltage level of the floating gate is positive, and therefore the threshold level of the selected transistor $Q_{11}$ is reduced. Thus, the transistor $Q_{11}$ is left in the normal-ON state. In this case, current flows from the column line Y to ground GND via the transistors $Q_{21}$ and $Q_{11}$, which are now ON.

Contrary to the above, if the selected memory cell MC stores the logic "0" (electron charges are held at the floating gate FG thereof), the voltage level of the floating gate FG is negative, and therefore the threshold level of the selected transistor $Q_{11}$ is increased. Thus, the transistor $Q_{11}$ is left in normal-OFF state. In this case, no current flows from the column line Y to ground GND via the transistors $Q_{21}$ and $Q_{11}$.

As mentioned above, the stored data "1" or "0" is read from each memory cell. In this case, the voltage level at the control gate CG is not restricted to the above-mentioned zero voltage, but, may be a suitable positive voltage level which is predetermined, for an erase operation and a write operation, according to the respective threshold levels of the memory cells.

The following table I shows the voltage level developed at the row line X; the program line Y' and the column line Y, to be supplied in each of the read (READ), the write (WRITE), the partial-erase (PARTIAL ERASE) and the whole-erase (WHOLE ERASE) operations, with respect to the selected memory cell $MC_s$, the half-selected memory cell $MC_{HSX}$ having selected row line X only, the half-selected memory cell $MC_{HSY}$ having the selected column line Y only and the non-selected memory cell $MC_{non}$.

TABLE I

|  |  | $MC_S$ | $MC_{HSX}$ | $MC_{HSY}$ | $MC_{non}$ |
|---|---|---|---|---|---|
| READ | X | $V_4 \sim V_{CC}$ | $V_4$ | 0 | 0 |
|  | Y' | $V_2$ | $V_2$ or 0 | $V_2$ or 0 | $V_2$ or 0 |
|  | Y | $V_3$ | 0 | $V_3$ | 0 |
| WRITE | X | $V_1$ | $V_1$ | 0 | 0 |
|  | Y' | 0 | 0 | 0 | 0 |
|  | Y | $V_1$ | 0 | $V_1$ | 0 |
| PARTIAL ERASE | X | $V_1$ | $V_1$ | 0 | 0 |
|  | Y' | $V_1$ | 0 | $V_1$ | 0 |
|  | Y | 0 | 0 | 0 | 0 |
| WHOLE ERASE | X | $V_1$ |  |  |  |
|  | Y' | $V_1$ (all bits) |  |  |  |
|  | Y | 0 |  |  |  |

In the above cited Table I, the reference symbol $V_1$ denotes the positive high voltage higher than the ordinary power supply voltage level of $V_{CC}$; the reference symbol $V_2$ denotes a read voltage level at the line Y'; $V_3$ a read voltage level at the line Y; and, $V_4$ a suitable read voltage level at the row line X.

As can be understood from FIGS. 5 through 9, the memory circuit device of the present invention can be mass-produced readily. This is because, if slight locational error occurs in the location, with respect to the diffusion area DF of the row line X, the control gate CG or the floating gate FG, in vertical and/or horizontal directions in the drawing of FIG. 5, such a locational error does not cause a significant defect in manufactured memory cells, due to the presence of the U-shaped diffusion area DF.

Figure 11:
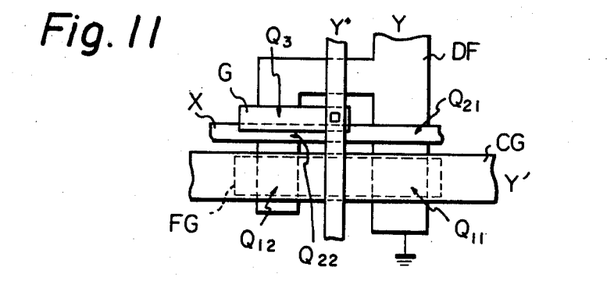
FIG. 11 is a plan view of another embodiment of the memory cell according to the present invention.

FIG. 11 illustrates a plan view showing the other embodiment of the memory cell according to the present invention. This figure corresponds to FIG. 5 showing the first embodiment according to the present invention. The members referenced by the same reference symbols as those of FIG. 5 are substantially the same. Therefore, a third selecting transistor $Q_3$ and an additional program line Y" are newly introduced therein. The third selecting transistor $Q_3$ cooperates with the second selecting transistor $Q_{22}$. In this case, the previously mentioned program line PR (FIG. 2) is composed of the first program line Y' and the second program line Y". The second program line Y" is coupled to the gate G of the third selecting transistor $Q_3$. The channel of the transistor $Q_3$ is also formed inside the U-shaped diffusion area DF. The first program line Y' is arranged in parallel with the row line X. The second program line Y" is arranged in parallel with the column line Y. The line Y" is selected by means of the decoder circuit, usually used for selecting a desired one of the column lines Y.

Figure 12:
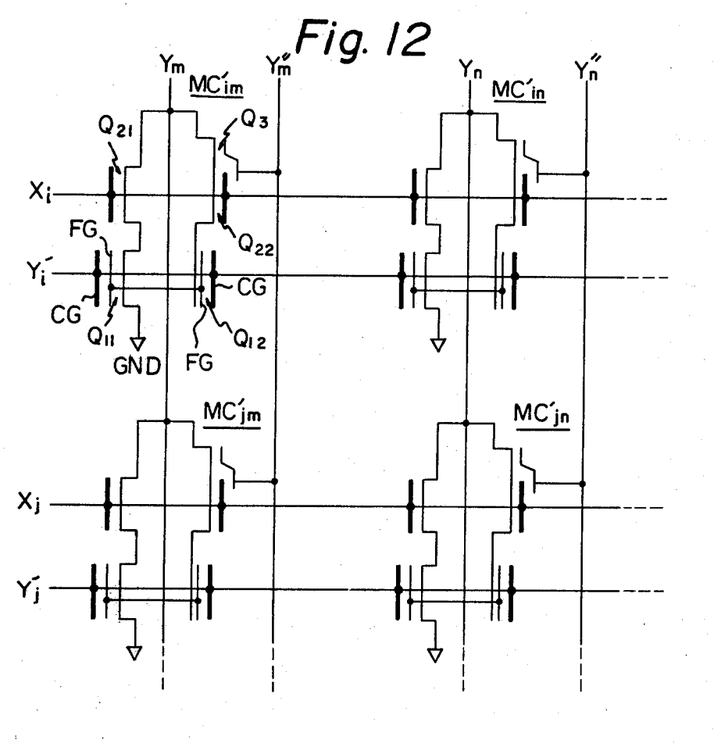
FIG. 12 is a memory circuit diagram comprised of many memory cells of another embodiment according to the present invention.

FIG. 12 illustrates a memory circuit diagram comprised of many memory cells of another embodiment according to the present invention. However, only two column lines are illustrated as $Y_m$ and $Y_n$, only two row lines are illustrated as $X_i$ and $X_j$, only two first program lines are illustrated as $Y'_i$ and $Y'_j$, only two second program lines are illustrated as $Y'''_m$ and $Y'''_n$, and only four memory cells are illustrated as $MC'_{im}$, $MC'_{in}$, $MC'_{jm}$ and $MC'_{jn}$. Further it should be understood that, in each memory cells (MC), the locations of the transistors ($Q_{22}$, $Q_{12}$, $Q_3$) and ($Q_{21}$, $Q_{11}$) are reversed with respect to the locations thereof shown in FIG. 11, so as to simplify the illustration of the wiring diagram of FIG. 11.

In FIG. 12, when the column line $Y_m$ is selected, the corresponding line $Y'''_m$ is also selected, and similarly when the column line $Y_n$ is selected, the corresponding line $Y'''_n$ is selected.

When the write operation is commenced, in the selected one, for example $MC'_{im}$, of the memory cells, the positive high voltage is applied to the column line $Y_m$ ($Y_m = V_H$), the positive high voltage is applied to the second program line $Y'''_m$ ($Y'''_m = V_H$) and the positive high voltage is applied to the row line $X_i$ ($X_i = V_H$). Accordingly, the first, second and third selecting transistors $Q_{21}$, $Q_{22}$ and $Q_3$ are turned to ON and at the same time the positive high voltage is applied to each drain D of the read and write-erase transistors $Q_{11}$ and $Q_{12}$. In this case, since zero voltage is applied to the control gate CG, the electron charges are removed from the floating gate FG of the transistor $Q_{12}$ to the drain D thereof. Thus, the write operation is completed. In the case as mentioned above, regarding the non-selected memory cell $MC'_{jn}$ and the half-selected memory cells $MC'_{in}$ and $MC'_{jm}$, since firstly no positive high voltage $V_H$ is applied to the drain of the corresponding transistor $Q_{12}$ and secondly the corresponding transistors $Q_{22}$ and $Q_3$ are OFF, an undesired write operation for these non-selected and half-selected memory cells cannot be expected to occur.

When the whole-erase operation is commenced, zero voltage is applied to all the column lines ($Y_m$, $Y_n$ ...), the positive high voltage $V_H$ is applied to all the row lines ($X_i$, $X_j$ ...), the positive high voltage $V_H$ is applied to all the first program lines ($Y'_i$, $Y'_j$ ...) and the voltage $V_H$ is applied to all the second program lines ($Y'''_m$, $Y'''_n$ ...), and thereby the electron charges are injected from the drain D of each transistor $Q_{12}$ to the floating gate FG thereof. Thus, the whole-erase operation is completed.

When the partial-erase operation is commenced, a similar condition of the above whole-erase operation is satisfied with respect only to the selected memory cell, for example $MC'_{im}$. In this case, regarding the half-selected memory cell $MC'_{in}$ having the selected row line $X_i$ and the non-selected column line $Y_n$, the second program line $Y'''_n$ is also non-selected, and accordingly the transistor $Q_3$ is turned to OFF, and the transistor $Q_{12}$ of the cell $MC'_{in}$ becomes a floating state. Consequently, the voltage level of the drain D of this transistor $Q_{12}$ changes together with the voltage level of the control gate CG and also the floating gate FG of the transistor $Q_{12}$ in the cell $MC'_{in}$. Thereby, no undesired erase operation can be expected to occur in the half-selected memory cell $MC'_{in}$.

Regarding the half-selected memory cell $MC'_{jm}$ having the non-selected row line $X_j$ and the selected column line $Y_m$, since the first program line $Y'_j$ is not selected, there is no possibility that any electron charges are injected into the floating gate FG of the cell $MC'_{jm}$. Regarding the non-selected memory cell $MC'_{jn}$, since the lines $X_j$, $Y_n$, $Y'''_n$ and $Y'_j$ are not selected, there is also no possibility that any electron charges are injected into the floating gate FG of the cell $MC'_{jn}$. This is why no undesired erase operation is caused in any of the memory cells other than the selected memory cell.

The read operation of the memory shown in FIG. 12 is substantially the same as that of FIG. 10. In this case, the first program lines $Y'_i$, $Y'_j$ ... of FIG. 12 correspond to the program lines $Y'_m$, $Y'_n$ ... of FIG. 10. The second program line $Y'''_m$, $Y'''_n$ ... of FIG. 12 can be in free states during the read operation, that is the voltage level of these lines $Y'''_m$, $Y'''_n$ may be a high voltage or a low voltage level. Thus, operations of the memory shown in FIG. 12 are classified as represented by the following Table II. Table II corresponds to the previously cited Table I.

TABLE II

|  |  | $MC_S$ | $MC_{HSX}$ | $MC_{HSY}$ | $MC_{non}$ |
|---|---|---|---|---|---|
| READ | X | $V_4 \sim V_{CC}$ | $V_4$ | 0 | 0 |
|  | Y' | $V_2$ | $V_2$ | $V_2$ or 0 | $V_2$ or 0 |
|  | Y | $V_3$ |  | $V_3$ | 0 |
|  | Y''' | — | — | — | — |
| WRITE | X | $V_1$ | $V_1$ | 0 | 0 |
|  | Y' | 0 | 0 | 0 | 0 |
|  | Y | $V_1$ | 0 | $V_1$ | 0 |
|  | Y''' | $V_1$ | 0 | $V_1$ | 0 |
| PARTIAL ERASE | X | $V_1$ | $V_1$ | 0 | 0 |
|  | Y' | $V_1$ | $V_1$ | 0 | 0 |
|  | Y | 0 | 0 | 0 | 0 |
|  | Y''' | $V_1$ | 0 | $V_1$ | 0 |
| WHOLE ERASE | X | $V_1$ |  |  |  |
|  | Y' | $V_1$ (all bits) |  |  |  |
|  | Y | 0 |  |  |  |
|  | Y''' | $V_1$ |  |  |  |

The advantages of the memory defined by the illustrations of FIGS. 11 and 12 are substantially the same as that of the memory explained previously.

I claim:

1. A nonvolatile memory comprising:
   a plurality of memory cells;
   a plurality of intersecting column lines, row lines and program lines connected to the memory cells, each of the memory cells comprising:
   a selecting transistor; and
   a programming transistor connected in series with said selecting transistor,
   said programming transistor including a control gate and a floating gate,
   said selecting transistor having a drain connected to one of the column lines, and having a gate connected to one of the row lines,
   said programming transistor having a control gate connected to one of the program lines,
   said selecting transistor being divided into first and second selecting transistors,
   said programming transistor being divided into a read transistor, having a floating gate provided with a relatively thick insulation layer thereunder, and a write-erase transistor having a floating gate provided partially with a relatively thin insulation layer thereunder,
   said first selecting transistor and said read transistor being connected in series, and the second selecting transistor and said write-erase transistor being connected in series.

2. A nonvolatile memory as set forth in claim 1,
   wherein said first and second selecting transistors and said read and write-erase transistors are formed in and on a semiconductor substrate,
   wherein the semiconductor substrate contains a U-shaped diffusion area therein, wherein said U-shaped diffusion area is electrically connected to said one of the column lines, so as to form drains and sources of said first and second selecting transistors and said read and write-erase transistors, wherein said first selecting transistor and said read transistor are formed on and along one leg of said U-shaped diffusion area, and wherein said second selecting transistor and said write-erase transistor are formed on and along the other leg thereof.

3. A nonvolatile memory as set forth in claim 2, wherein said first and second selecting transistors are located adjacent to the connecting leg of said U-shaped diffusion area and wherein said read and write-erase transistors are located adjacent to the open end of said U-shaped diffusion area.

4. A nonvolatile memory as set forth in claim 3, wherein said one of the program lines has a minor part positioned in parallel with said row lines, wherein the gates of said first and second selecting transistors are connected, at respective cross portions, with said one of said row lines which is arranged perpendicular to said one of said column lines, wherein the control gates of said write-erase transistor and said read transistor are connected at respective cross portions to said minor part of said one of said program lines.

5. A nonvolatile memory as set forth in claim 4, wherein said major part of said one of said program lines is positioned in parallel with said one of said column lines.

6. A nonvolatile memory as set forth in claim 5, wherein said U-shaped diffusion area has n+-type conductivitiy.

7. A nonvolatile memory as set forth in claim 6, wherein the channel formed between the drain and the source of said write-erase transistor has n-type conductivity.

8. A nonvolatile memory comprising:
memory cells arranged in a matrix;
column lines connected to said memory cells;
row lines connected to said memory cells and intersecting said column lines; and
program lines connected to said memory cells, each of said memory cells comprising:
a first selecting transistor having a drain connected to a corresponding one of the column lines and having a gate connected to a corresponding one of the row lines;
a second selecting transistor having a drain connected to the corresponding one of the column lines and having a gate connected to the corresponding one of the row lines;
a read transistor connected in series with said first selecting transistor, having a control gate connected to a corresponding one of the program lines and having a floating gate having a relatively thick insulation layer thereunder; and
a write-erase transistor connected in series with the second selecting transistor, having a control gate connected to the corresponding one of the program lines and having a floating gate having a relatively thick insulation layer thereunder.

9. A nonvolatile memory as set forth in claim 8, wherein said first and second selecting transistors and said read and write-erase transistors are formed in and on a semiconductor substrate,
wherein the semiconductor substrate includes a U-shaped diffusion area having first and second legs, each having first and second ends, and a connecting portion with connects said first ends of said first and second legs,
wherein said U-shaped diffusion area is electrically connected to the corresponding one of the column lines,
wherein said U-shaped diffusion area forms the drains and sources of said first and second selecting transistors and said read and write-erase transistors,
wherein said first selecting transistor and said read transistor are formed on and adjacent said first leg of said U-shaped diffusion area, and
wherein said second selecting transistor and said write-erase transistor are formed on and adjacent the second leg of said U-shaped diffusion area.

10. A nonvolatile memory as set forth in claim 9, wherein said first and second selecting transistors are positioned on the first end of said first and second legs, respectively, and wherein said read and write-erase transistors are positioned on the second ends of said first and second legs, respectively.

11. A nonvolatile memory as set forth in claim 8, further comprising additional program lines connected to said memory cells, wherein each of said memory cells further comprises a third selecting transistor connected to said second selecting transistor and having a gate connected to a corresponding one of the additional program lines.

* * * * *

UNITED STATES PATENT AND TRADEMARK OFFICE
CERTIFICATE OF CORRECTION

PATENT NO. : 4,402,064

DATED : AUGUST 30, 1983

INVENTOR(S) : HIDEKI ARAKAWA

It is certified that error appears in the above-identified patent and that said Letters Patent is hereby corrected as shown below:

Col. 4, line 39, "groun" should be --ground--.

Col. 12, line 24, "with" should be --which--.

Signed and Sealed this

Twenty-ninth Day of November 1983

[SEAL]

Attest:

GERALD J. MOSSINGHOFF

Attesting Officer

Commissioner of Patents and Trademarks